(12) United States Patent
Yamashita et al.

(10) Patent No.: US 7,211,892 B2
(45) Date of Patent: May 1, 2007

(54) SEMICONDUCTOR DEVICE HAVING A PARTICULAR ELECTRODE STRUCTURE

(75) Inventors: Shiro Yamashita, Fujisawa (JP); Yoichi Abe, Yamato (JP); Kenichi Yamamoto, Hino (JP); Ryosuke Kimoto, Hamura (JP); Hiroshi Kawakubo, Fussa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/146,044

(22) Filed: Jun. 7, 2005

(65) Prior Publication Data

US 2006/0151877 A1     Jul. 13, 2006

(30) Foreign Application Priority Data

Jun. 8, 2004   (JP) .............................. 2004-170234

(51) Int. Cl.
*H01L 29/40*     (2006.01)
(52) U.S. Cl. .................. 257/737; 257/738; 257/E23.02
(58) Field of Classification Search ................ 257/737, 257/738, 779, E23.02, E23.021, 323.069
See application file for complete search history.

(56) References Cited

U.S. PATENT DOCUMENTS

2002/0171152 A1* 11/2002 Miyazaki .................... 257/778

OTHER PUBLICATIONS

Atsushi Yamaguchi et al., "Microstructure and Properties of CSP (Chip Size Package) Solder Joint using Sn-Zn-Bi Solder, -Influence of Ni/Au plating on solder joint properties", Mate 2003, pp. 309-314.
Y. Soga, "Influence of Interfacial Reaction Layer on Reliability of CSP Joint Using Sn-8Zn-3Bi Solder", MES 2003, pp. 57-60.
Kenzo Hatada, "A study of an solder bump fabrication technology using of anisotropic electro-less plating and dipping processes of Ni", MES 2003, pp. 272-275.

* cited by examiner

*Primary Examiner*—Minhloan Tran
*Assistant Examiner*—Benjamin Tzu-Hung Liu
(74) *Attorney, Agent, or Firm*—Mattingly, Stanger, Malur & Brundidge, P.C.

(57) ABSTRACT

In order to inhibit the connection failure due to the degradation of the connection interface strength of the electrode pad and the warp thereof in the semiconductor device having an electrode pad, a metal layer formed on the electrode pad, and a metal bump formed on the metal layer, in the present invention, gold (Au) is contained in the metal layer, the metal bump is made of solder mainly made of Sn and designed to have an average height H of 100 μm or less per unit area in the electrode pad, and the concentration of Au of the metal layer dissolved in the solder is set to $1.3 \times 10^{-3}$ (Vol %) or less. More preferably, the metal bump contains palladium (Pd), and the solder coating for forming the metal bump on the electrode pad is performed by using the dipping and the paste printing in combination.

7 Claims, 11 Drawing Sheets

FIG. 4
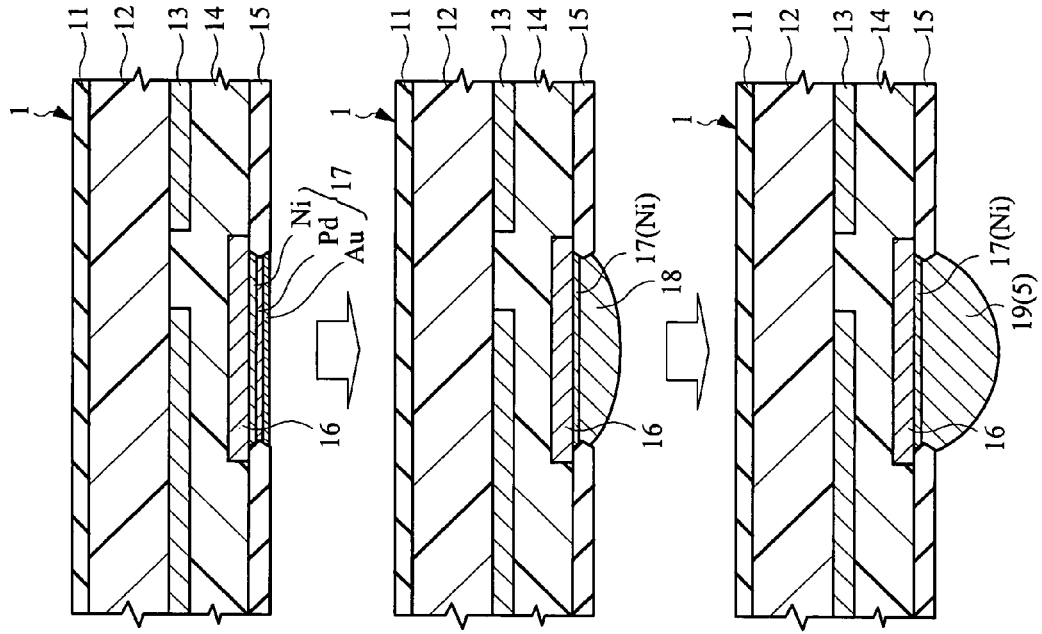
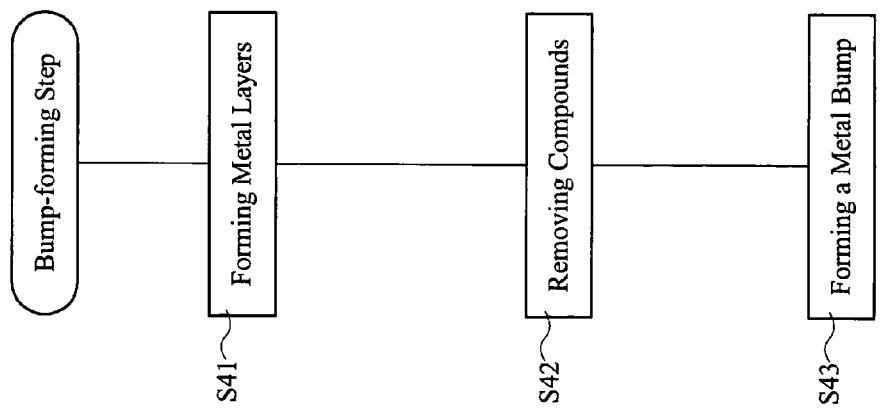

| | |
|---|---|
| Number of Pads | 256 |
| Pitch between the Pads | 1.27 |
| Size (Radius) of the pad | 0.62 |
| Metallization Structure | Au(0.75 μm) / Pd(0.2 μm) / an elctroless Ni-P plating(8 μm) |

FIG. 7

| | |
|---|---|
| Sorts of Solders (Ball,Paste,Dip) | Sn3Ag0.5Cu |
| Radius of Solder Ball | 0.4 |
| Opening Shape of a Printing Mask | 0.8 × 0.1t |

FIG. 8

| | Reflow Condition |
|---|---|
| (1) Solder Ball Connection (BGA Connection) | Reflow Temperature : 230℃, 240℃, 250℃<br>Reflow Time : 30s, 60s, 120s, 180s |
| (2) Solder Paste Printing | Reflow Temperature : 230℃, 240℃, 250℃<br>Reflow Time : 30s, 60s, 120s, 180s |
| (3) Dip + Solder Paste Printing | Dip 228℃ × 30s + Reflow Temperature : 230℃, 240℃, 250℃<br>Reflow Time : 30s, 60s, 120s, 180s |

Reflow : In the Atmosphere on a hot plate, Dip : In the Atmosphere
Each using Flux

FIG. 10
(1) Solder Ball Connection (BGA Connection)
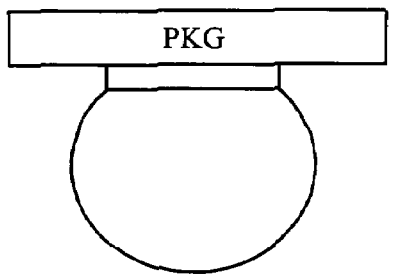
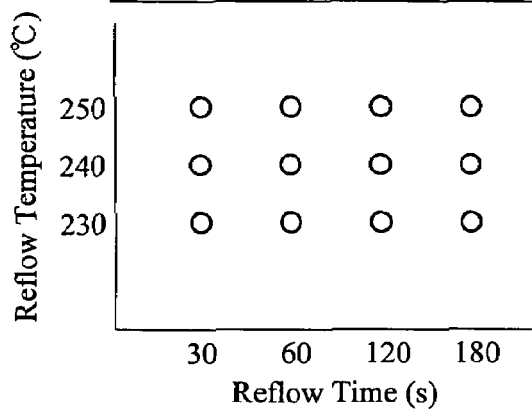
(2) Solder Paste Printing
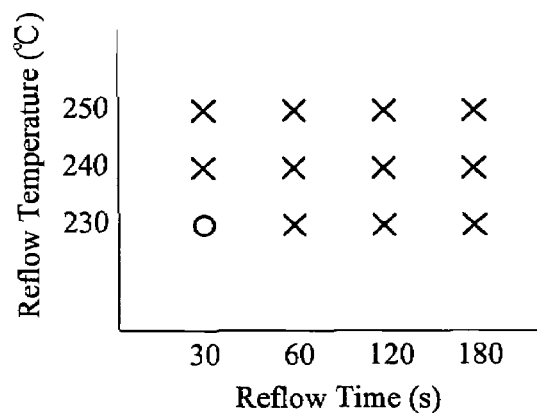
(3) Dip + Solder Paste Printing
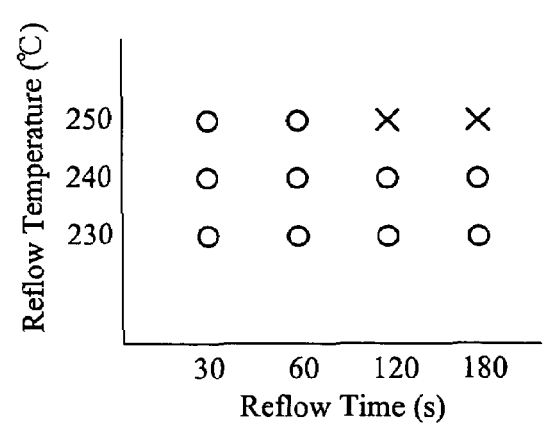

Under High Temperature
in a Long Stretch
(250°C, 180s)

(230°C, 60s)

Under Low Temperature
for a Short Time
(210°C, 5s)

SEMICONDUCTOR DEVICE HAVING A PARTICULAR ELECTRODE STRUCTURE

CROSS-REFERENCE TO RELATED APPLICATION

The present application claims priority from Japanese Patent Application No. JP2004-170234 filed on Jun. 8, 2004, the content of which is hereby incorporated by reference into this application.

TECHNICAL FIELD OF THE INVENTION

The present invention relates to a semiconductor device and a manufacturing method thereof. More particularly, the present invention relates to a technology effectively applied to a solder-coating method of an electrode pad for realizing a solder connecting portion which does not reduce the connection reliability even in a packaging component which can achieve the reduction in space and thickness and to a packaging component created in accordance with the solder-coating method.

BACKGROUND OF THE INVENTION

The miniaturization of mobile devices such as a mobile phone and PDA (Personal Digital Assistant) has been progressing and the performance thereof has been improved more and more in recent years, and the BGA (Ball Grid Array) and the CSP (Chip Scale Package) have been used in many cases as the mounting technology which can accommodate the miniaturization and the performance improvement. However, because of the demand for the further miniaturization and thickness reduction, a thin-type package such as the LGA (Land Grid Array) in which even the solder bump height is reduced has been increasingly adopted. However, the thin-type package has the problems as follows.

First, in the case where the package size is increased, the influence of warp of the package itself or the substrate becomes large and the connection failure due to the warp occurs at the time of reflow. Also, since the amount of solder used for the connection is reduced in the thin-type package, the package/substrate distance after the connection is reduced, and the growth rate of the crack formed at the solder connecting portion due to the difference in the linear expansion coefficient between the package and the substrate is increased. Consequently, the thermal fatigue life is shortened.

Furthermore, the lead-free solder has been widely used in recent years. The Sn—Ag—Cu series solder which is highly reliable and is the most dominant lead-free solder has the melting point of 217° C., which is more than 30° C. higher than the melting point of conventionally used Sn37Pb solder of 183° C. Therefore, it is necessary to increase the reflow temperature, and hence, it is difficult to mount the low heat resistant parts. For the solution of the problem, low melting point Pb free solders such as Sn—Zn series solder and Sn—In series solder has come into use. However, it is known that the strength of the connection interface is reduced when the Sn—Zn series solder of the low melting point solders is used for the connection to the pad having a metallization (e.g. metallized layer) containing Au.

The result of the study as a premise of the present invention by the inventors thereof will be described here. FIG. 12 shows the result of evaluation of the strength of the connection interface by means of the shear test to the samples in which an $Sn_8Zn_3Bi$ solder ball is connected to a pad having metallization of Au/Pd/an electroless Ni—P plating while changing the reflow temperature and the reflow time. In this shear test, as shown in FIG. 12A, the sample is inclined at 25° so as to sufficiently apply the load to the connection interface, and the sample is shorn at the high velocity of 4 mm/s (mm/s: Millimeter per Second). In this evaluation by the shear test, as is understood from the results of FIG. 12B (reflow temperature: 250° C.), FIG. 12C (reflow temperature: 230° C.) and FIG. 12D (reflow temperature: 210° C.), the shearing strength is reduced under the reflow conditions of high reflow temperature and long reflow time.

Also, the solder/metallization interfacial breaking occurs under all of the conditions in this evaluation. FIG. 13 shows the observation results of the cross section of the connection interface by the SEM (an abbreviation of Scanning Electron Microscope) when the $Sn_3Ag_{0.5}Cu$ solder is connected to the pad having the metallization of Au/Pd/an electroless Ni—P plating. Similarly, FIGS. 14A, 14B and 14C show the observation results of the cross section of the connection interface by the SEM when the $Sn_8Zn_3Bi$ solder is connected to the pad having metallization of Au/Pd/an electroless Ni—P plating. As shown in FIG. 13, when the $Sn_3Ag_{0.5}Cu$ solder is connected, the Sn—Cu—Ni series compound is formed at the solder/metallization interface, and the solder is reacted with the electroless Ni—P plating. However, as shown in FIG. 14, when the $Sn_8Zn_3Bi$ solder is connected, the Au—Zn compound and the Pd—Zn compound are formed at the connection interface, and the solder is not reacted with the electroless Ni—P plating. For example, pp. 309–314 of "Structure of CSP connecting portion using Sn—Zn—Bi solder and joint properties, influence of Ni/Au plating" by Yamaguchi et al. Mate 2003 (2003) and pp. 57–60 of "Influence of interface structure on joint properties in CSP mounting using $Sn_8$—$Zn_3$—Bi solder" by Togawa et al. MES2003 (2003) show that the connection reliability is reduced when Au—Zn compound is formed at the connection interface of $Sn_8Zn_3Bi$ solder and the metallization of Au/Ni plating.

Also, as the bump forming technology considered to be suitable for the thin package, pp. 272–275 of "Study of anisotropic Ni bump formation by electroless plating method and bump forming technology by dipping method" by Hatakeda MES2003 (2003) discloses the method in which a thick Ni core instead of a bump is formed by plating and solder is thinly supplied onto the Ni core by dipping, thereby forming the solder bump. According to this method, the package/substrate distance can be increased and the thermal fatigue life can be extended. Also, since the metallization does not contain Au and Pd, Au—Zn compound and Pd—Zn compound which cause the reduction of the connection interface strength are not formed even if the $Sn_8Zn_3Bi$ solder is used for the connection. In this bump forming method, however, the effect of preventing the occurrence of connection failure due to the warp of the package is small, and since this forming method of the Ni core uses the plating, the time required to form the Ni core is long when extending the package/substrate distance.

SUMMARY OF THE INVENTION

Meanwhile, as the method for solving the problems described above, the inventors of the prevent invention have created the structure in which the solder with a certain thickness is coated in advance on the electrode pad. The structure of this solder coating method is shown in FIG. 15A (the structure of the BGA connection method using solder ball is shown in FIG. 15B for comparison). In this structure, since the amount of solder used for the connection is increased in comparison to the LGA, the occurrence of connection failure due to the warp of the package can be inhibited. Also, since the package/substrate distance is increased, the thermal fatigue life can be extended. Furthermore, since Au and Pd of the metallization of the pad can be dissolved into the solder, it is possible to prevent the Au—Zn compound and Pd—Zn compound from being formed at the connection interface when the Sn—Zn series solder is used for the connection. As a result, it is possible to inhibit the reduction of the strength of the connection interface.

However, in the structure in which the solder is coated, the coating process is problematic. When using the solder ball or the solder paste printing and the metallization of the pad contains Au and Pd, it is possible to remove Au and Pd from the solder/metallization connection interface by dissolving Au and Pd into the solder. However, since the Au—Sn compound and Pd—Sn compound are collected in the solder adjacent to the connection interface, the strength of the connection interface is reduced, and the interfacial breaking frequently occurs. For its prevention, the dipping method and flow solder method which can remove the compound adjacent to the connection interface are considered as candidates. In these methods, however, since the amount of solder to be coated depends on the pad area, if the fine pitch is employed in the future, it is impossible to supply the amount of solder capable of preventing the occurrence of the connection failure due to the warp of the package and the substrate and providing the desired thermal fatigue life.

In such a circumstance, an object of the present invention is to provide a technology capable of forming a semiconductor device having an electrode pad coated with solder in which the reduction of the strength of the connection interface can be prevented, the connection failure due to the warp does not occur, and the necessary thermal fatigue life can be provided by performing the solder coating while using the dipping method and the solder paste printing in combination.

The present invention is applied to a semiconductor device provided with an electrode pad, a metal layer formed on the electrode pad, and a metal bump formed on the metal layer. More particularly, the metal layer contains Au, the metal bump has an average bump height in one electrode pad per unit area of 100 µm or less and is made of solder mainly made of Sn, and the concentration of Au of the metal layer dissolved in the solder of the metal bump is $1.3 \times 10^{-3}$(Vol %) or less. Furthermore, the metal layer contains Pd in addition to Au.

Also, in the semiconductor device according to the present invention, the metal bump is characterized in that the compound formed by reacting Pd of metal layer formed on the electrode pad before connecting the metal bump with the metal bump is not present in a row within the range of 2 to 20 µm from the interface between the metal bump and the electrode pad on which the metal bump is connected. Alternatively, the metal bump is characterized in that, after a stretch of time under the high-temperature condition of the highest temperature of 212 to 217° C. and retention time at 198° C. or higher of 42 seconds, the compound formed by reacting Au of metal layer formed on the electrode pad before connecting the metal bump with the metal bump is not present in a row within the range of 2 to 20 µm from the interface between the metal bump and the electrode pad on which the metal bump is connected.

More specifically, the semiconductor device according to the present invention is applied to a package structure in which a substrate provided with the electrode pad and a semiconductor chip mounted on the substrate are provided, and the metal bump formed on the electrode pad functions as an external terminal. Alternatively, it is applied to a wafer level package structure in which a semiconductor chip on which the electrode pad is provided, and the metal bump formed on the electrode pad functions as an external terminal.

In addition, a manufacturing method of a semiconductor device according to the present invention comprises: a bump-forming step for forming a metal bump on an electrode pad, wherein the bump-forming step includes: a first step of forming a metal layer containing Au on the electrode pad; a second step of supplying solder mainly made of Sn onto the metal layer of the electrode pad and removing Au—Sn compound from an interface between the metal layer and the solder; and a third step of supplying solder onto the metal layer in which the compound has been removed to form the metal bump. Furthermore, a metal layer containing Pd in addition to Au is formed on the electrode pad in the first step, and Pd—Sn compound in addition to the Au—Sn compound is removed from the interface between the metal layer and the solder in the second step.

More specifically, in the manufacturing method of a semiconductor device according to the present invention, the metal layer on the electrode pad is dipped in melted solder to dissolve Au and Pd of the metal layer into solder and the metal layer is reacted with the solder to remove the Au—Sn compound and the Pd—Sn compound in the solder adjacent to the connection interface in the second step. Alternatively, the melted solder is brought into contact with the metal layer on the electrode pad by means of jet flow to dissolve Au and Pd of the metal layer into the solder and the metal layer is reacted with the solder to remove the Au—Sn compound and the Pd—Sn compound in the solder adjacent to the connection interface in the second step.

According to the present invention, it is possible to realize a semiconductor device having an electrode pad coated with solder in which the reduction of the strength of the connection interface can be prevented, the connection failure due to the warp does not occur, and the necessary thermal fatigue life can be provided by performing the solder coating while using the dipping method and the solder paste printing in combination.

BRIEF DESCRIPTIONS OF THE DRAWINGS

FIG. 4 is a flow diagram and a cross-sectional view showing the bump-forming step in detail in the manufacturing method of a semiconductor device according to an embodiment of the present invention;

FIG. 7 is an explanatory diagram of the sorts of solders, the radius of the solder ball, and the opening shape of a paste printing mask used for the sturdy of the connection interface strength of the solder coating structure in the semiconductor device according to an embodiment of the present invention;

FIG. 8 is an explanatory diagram of the solder coating condition used for the sturdy of the connection interface strength of the solder coating structure in the semiconductor device according to an embodiment of the present invention;

FIG. 10 is an explanatory diagram showing the relation between the connection interface strength and the reflow condition in each of the coating processes in the semiconductor device according to an embodiment of the present invention;

Figure 14A:
Figure 14B:
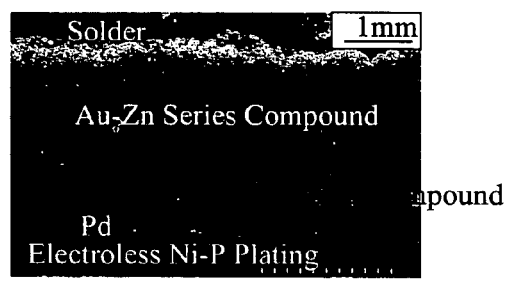
Figure 14C:
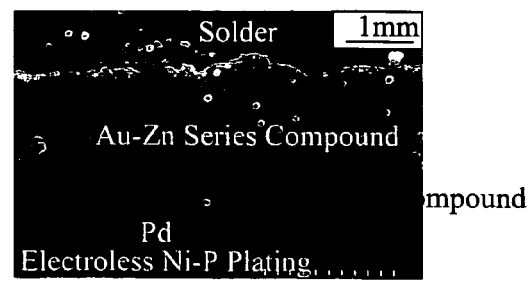
Figure 15A:
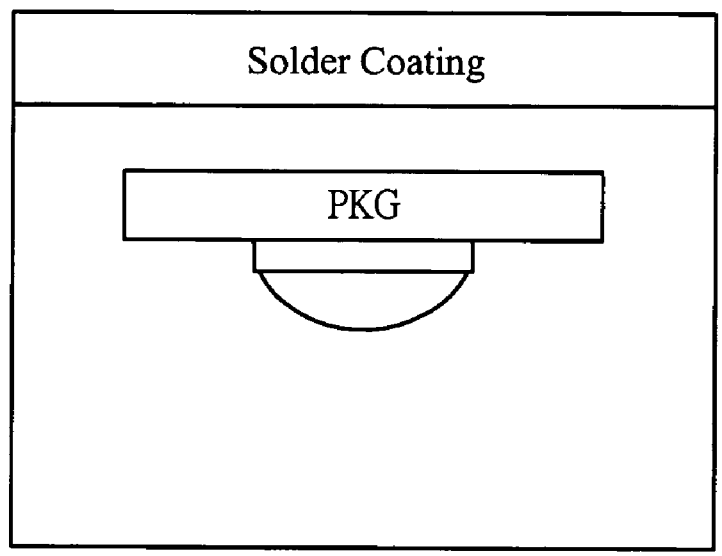
Figure 15B:
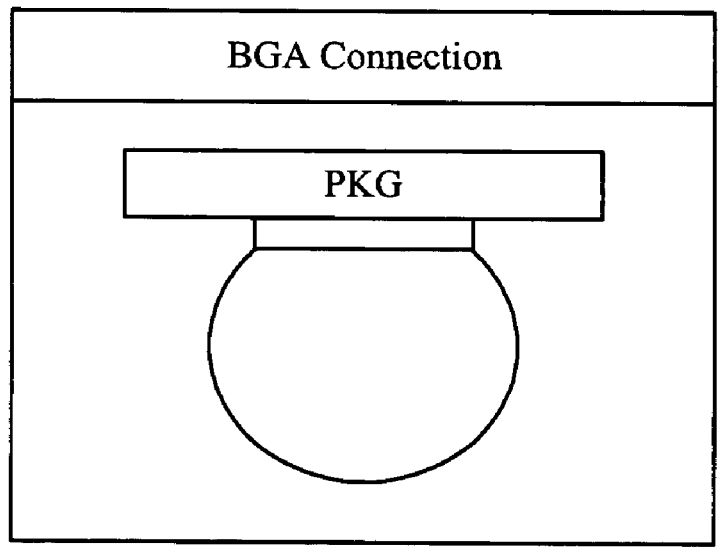

FIG. 14A to FIG. 14C are diagrams showing the observation results of the cross section of the connection interface by the SEM when the $Sn_8Zn_3Bi$ solder is connected to the pad having metallization of Au/Pd/an electroless Ni—P plating in the semiconductor device studied as a premise of the present invention; and FIG. 15A and FIG. 15B are diagrams showing the structure by the solder coating used in the semiconductor device according to the present invention and the structure by the BGA connection using the solder ball described for comparison.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
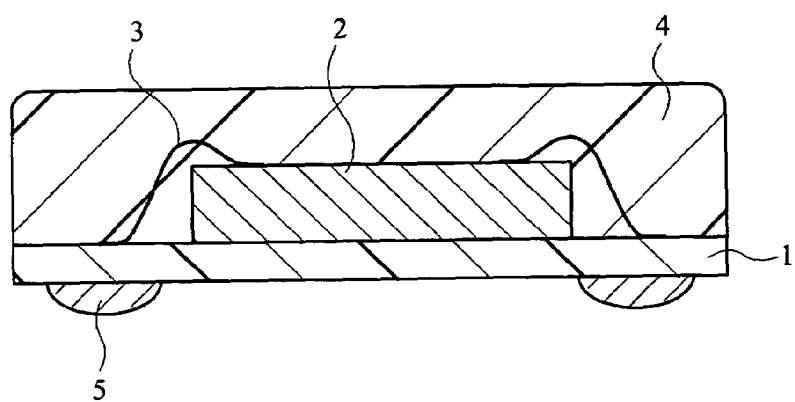
FIG. 1 is a cross-sectional view showing a semiconductor device according to an embodiment of the present invention.

First, an example of the structure of the semiconductor device according to an embodiment of the present invention will be described with reference to FIGS. 1 and 2. FIG. 1 is a cross-sectional view of the semiconductor device and FIG. 2 is an explanatory diagram of the dimensions of the metal bump, respectively.

The semiconductor device according to this embodiment comprises a package substrate 1 (described merely as a substrate, hereinafter), a semiconductor chip 2 mounted on the substrate 1, bonding wires 3 which electrically connect the pads on the substrate 1 and the electrodes on the semiconductor chip 2, a molding resin 4 for encapsulating exposed electrical components such as the semiconductor chip 2 and the bonding wires 3 mounted on the substrate 1, and metal bumps 5 provided on the rear surface of the substrate 1, and the semiconductor device has the package structure in which the metal bump 5 functions as an external terminal.

In particular, in the semiconductor device according to this embodiment, though the detail thereof will be described later, the substrate 1 is provided with an electrode pad 16 formed at the position on which the metal bump 5 is provided. A metal layer 17 containing Au and Pd is formed on the electrode pad 16, and the metal bump 5 is formed on the metal layer 17. For example, the metal bump 5 has the average bump height H of 100 μm or less per unit area in the one electrode pad of the metal bump 5 as shown in FIG. 2. Also, the metal bump 5 is made of solder mainly made of Sn, and the concentration of Au of the metal layer 17 dissolved in the solder of the metal bump 5 is $1.3 \times 10^{-3}$(Vol %) or less. Assuming a metal bump having its volume V [μm$^3$] formed on an electrode having an area of S [μm$^2$] so as to cover the electrode entirely therewith, the aforementioned average bump height H [μm] per unit area in the electrode is calculated as H=V/S for the thus formed metal bump, for example.

Figure 2:
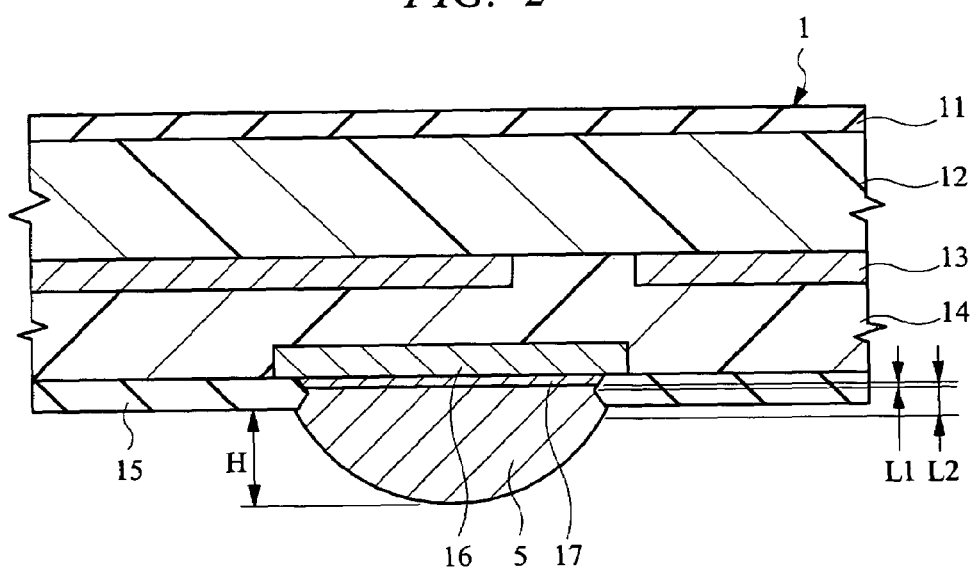
FIG. 2 is an explanatory diagram showing the dimensions of the metal bump in the semiconductor device according to an embodiment of the present invention.

In addition, as shown in FIG. 2, the metal bump 5 is characterized in that the compound formed by reacting Pd of the metal layer 17 formed on the electrode pad 16 before connecting the metal bump 5 with the metal bump 5 is not present in a row within the range of L1=2 to L2=20 μm from the interface between the metal bump 5 and the electrode pad 16 on which the metal bump 5 is connected. Alternatively, the metal bump 5 is characterized in that, after a stretch of time under the high-temperature condition of the highest temperature of 212 to 217° C. and retention time at 198° C. or higher of 42 seconds, the compound formed by reacting Au of metal layer 17 formed on the electrode pad 16 before connecting the metal bump 5 with the metal bump 5 is not present in a row within the range of L1=2 to L2=20 μm from the interface between the metal bump 5 and the electrode pad 16 on which the metal bump 5 is connected.

Figure 3:
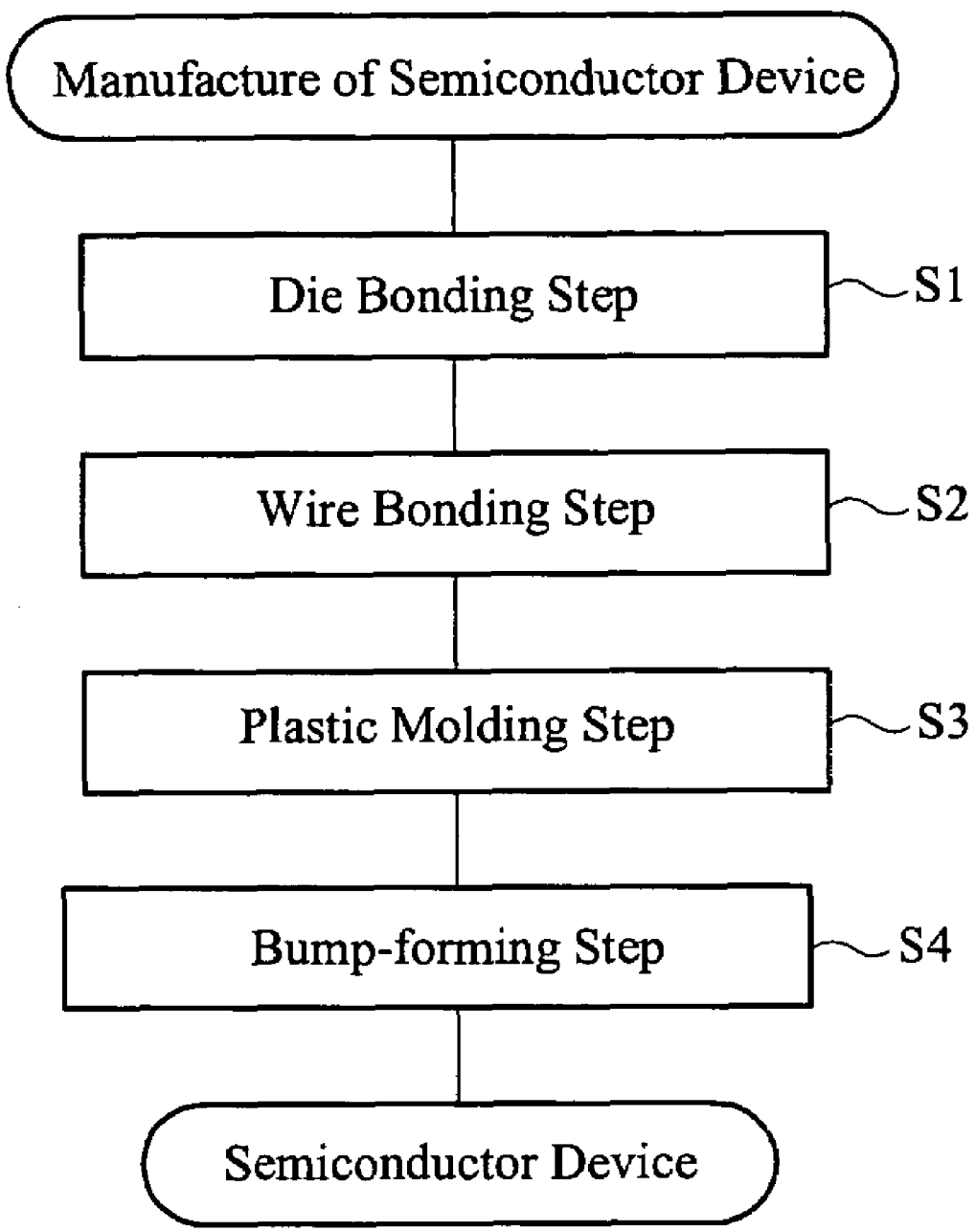
FIG. 3 is a flow diagram schematically showing the manufacturing method of a semiconductor device according to an embodiment of the present invention.
Figures 5, 6:
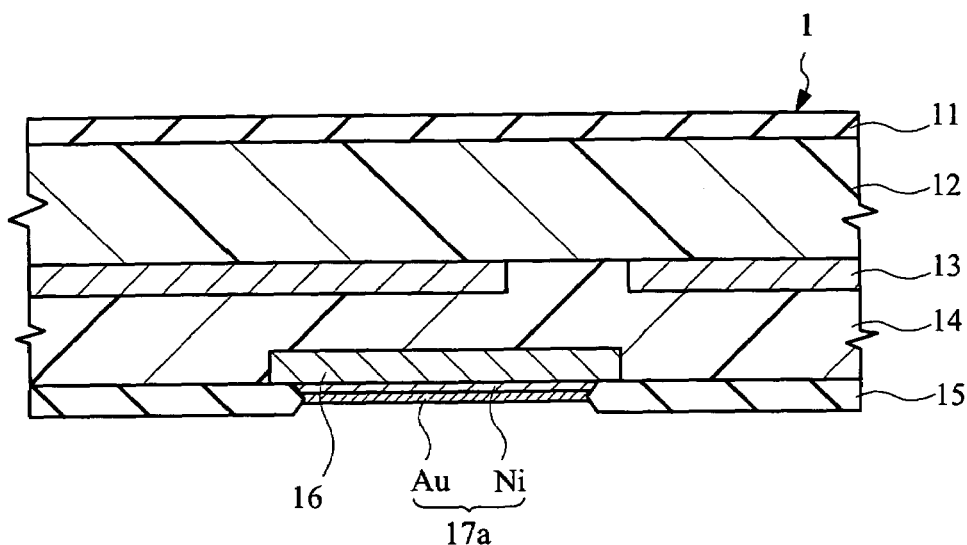
FIG. 5 is a cross-sectional view showing a modified example of the bump-forming step in the manufacturing method of a semiconductor device according to an embodiment of the present invention.
FIG. 6 is an explanatory diagram of the specifications of the substrate and the metallization used for the sturdy of the connection interface strength of the solder coating structure in the semiconductor device according to an embodiment of the present invention.

Next, an example of the manufacturing method of the semiconductor device according to this embodiment will be described with reference to FIGS. 3 to 5. FIG. 3 is a flow diagram schematically showing the manufacturing method of the semiconductor device, FIG. 4 is a flow diagram and a cross-sectional view (principal part of the substrate) showing the bump-forming step in detail, and FIG. 5 is a cross-sectional view showing a modified example of the bump-forming step (principal part of the substrate), respectively.

As shown in FIG. 3, in the manufacturing method of the semiconductor device according to this embodiment, after preparing the substrate 1, the semiconductor chip 2 and the like, the semiconductor device as shown in FIG. 1 is manufactured through a die bonding step (S1) in which the semiconductor chip 2 is mounted on the substrate 1, a wire bonding step (S2) in which a pad on the substrate 1 is electrically connected to an electrode on the semiconductor chip 2, a plastic molding step (resin molding step) (S3) in which exposed electrical components such as the semiconductor chip 2 and the wires 3 mounted on the substrate 1 are encapsulated with the molding resin 4, and a bump-forming step (a step of forming bumps) (S4) in which the metal bump 5 is provided on the rear surface of the substrate 1.

Particularly, as shown in FIG. 4, in the bump-forming step (S4), the metal bump 5 made of solder 18 and solder 19 is formed on the electrode pad 16 through a step (S41) of forming the metal layer 17 composed of Ni plating, Pd plating and Au plating on the electrode pad 16 made of Cu of the substrate 1 with a laminated structure of a solder resist 11, an insulating resin 12, an internal conductor 13 made of Cu, an insulating resin 14 and a solder resist 15, a step (S42) of supplying the solder 18 mainly made of Sn onto the metal layer 17 of the electrode pad 16 and removing Au—Sn compound and Pd—Sn compound from the interface between the metal layer 17 and the solder 18, and a step (S43) of additionally supplying the solder 19 onto the metal layer 17 in which the compound has been removed to form the metal bump 5.

More specifically, in this bump-forming step, for the structure in which the solder coating is applied to the electrode pad 16, Au and Pd of the metal layer 17 are first dissolved into the solder 18 by the dipping method and the Au—Sn compound and the Pd—Sn compound in the solder 18 adjacent to the connection interface are removed. Next, an amount of solder 19 capable of preventing the connection failure due to the warp of the package and the substrate and securing the package/substrate distance which can provide the desired thermal fatigue life is supplied by the solder paste printing. By doing so, the solder coating capable of preventing the degradation of the connection interface strength and the occurrence of the connection failure due to the warp and providing the desired thermal fatigue life can be realized.

More specifically, in the step (S42) of removing the compound from the interface between the metal layer 17 and the solder 18, the metal layer 17 on the electrode pad 16 is dipped in the melted solder 18 to dissolve Au and Pd of the metal layer 17 into the solder, and the metal layer 17 is reacted with the solder 18 to remove the Au—Sn compound and the Pd—Sn compound in the solder adjacent to the connection interface. Alternatively, the melted solder 18 is brought into contact with the metal layer 17 on the electrode pad 16 by means of jet flow to dissolve Au and Pd of the metal layer 17 into the solder, and the metal layer 17 is reacted with the solder 18 to remove the Au—Sn compound and the Pd—Sn compound in the solder adjacent to the connection interface. At this time, in order to ensure the reflow three times, the concentration of Au of the metal layer 17 dissolved in the solder of the metal bump 5 is set to, for example, $1.3 \times 10^{-3}$ (Vol %) or less based on the result of the experiment.

Note that, FIG. 5 is the cross-sectional view showing case where a metal layer 17a with a two-layer structure of Ni plating and Au plating instead of the metal layer with a three-layer structure is formed on the electrode pad 16 of the substrate 1 in the bump-forming step (S4). Also in this case, it is possible to remove the Au—Sn compound from the interface between the metal layer 17a and the solder 18 by supplying the solder 18 onto the metal layer 17a of the electrode pad 16, and then, the metal bump 5 can be formed by supplying the solder 19 onto the metal layer 17a in which the compound has been removed.

Figure 9:
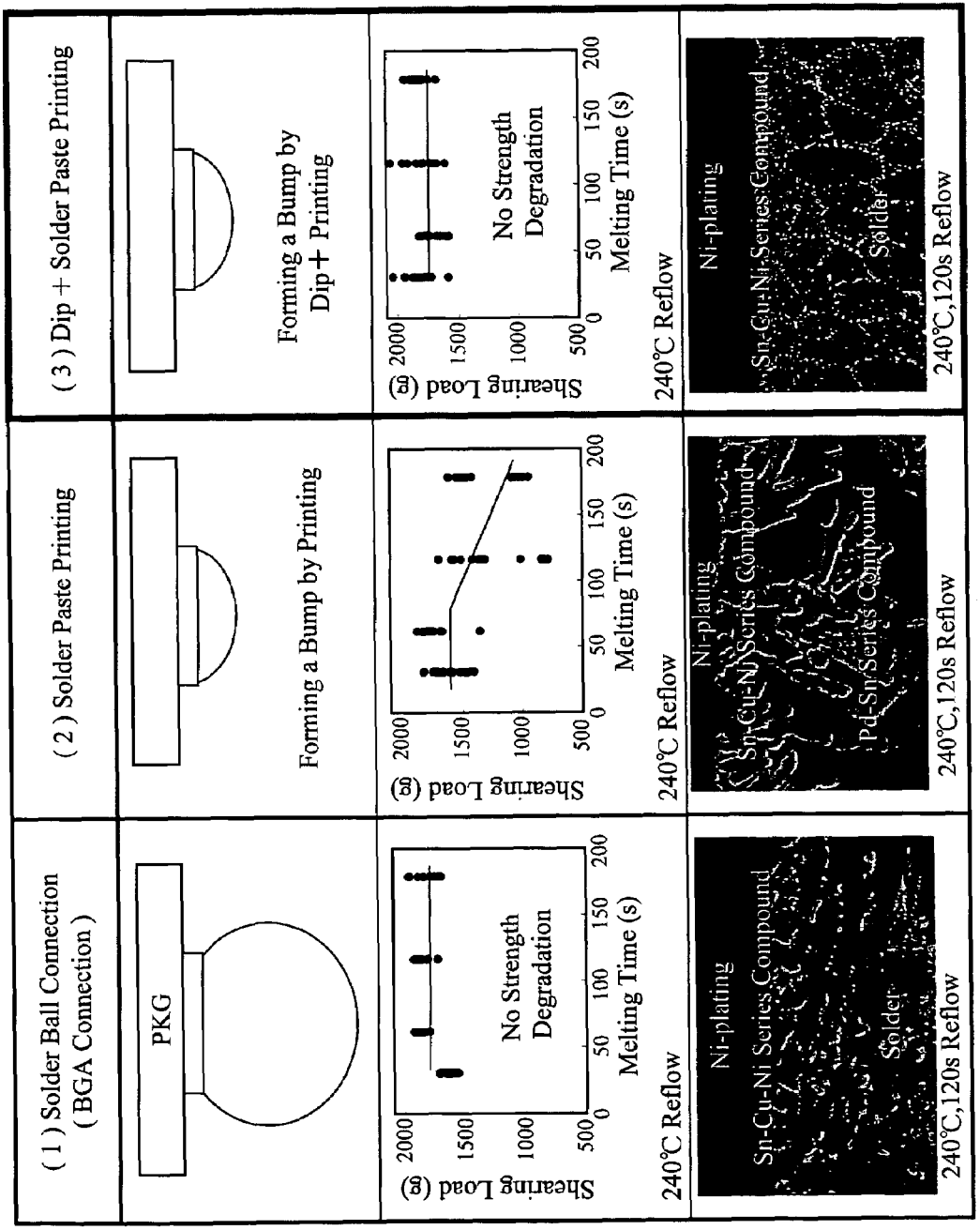
FIG. 9 is an explanatory diagram of the study result of the connection interface strength of the solder coating structure in the semiconductor device according to an embodiment of the present invention.

Next, the results of the study for the connection interface strength in the solder coating structure of the semiconductor device according to this embodiment will be described with reference to FIGS. 6 to 10. FIG. 6 is an explanatory diagram of the specifications of the substrate and the metallization used for the sturdy of the connection interface strength of the solder coating structure, FIG. 7 is an explanatory diagram of the sorts of solders, the radius of the solder ball, and the opening shape of a paste printing mask, FIG. 8 is an explanatory diagram of the solder coating condition, FIG. 9 is an explanatory diagram of the study result, and FIG. 10 is an explanatory diagram showing the relation between the connection interface strength and the reflow condition in each of the coating processes, respectively.

As shown in FIGS. 6 to 8, for the comparison purpose, the three types of the solder coating processes are studied, that is, (1) the case where the solder ball is connected for the BGA connection, (2) the case of the solder paste printing only, and (3) the case where the solder paste printing is performed after the dipping. The connection interface strength is evaluated by means of the shear test, and the sample is inclined at 25° so as to sufficiently apply the load to the connection interface and the sample is shorn at the high velocity of 4 mm/s. Also, with respect to (2) and (3), since the solder bump height is insufficient for the shear test after the coating, the solder ball is connected on the solder coating portion under the reflow conditions of 230° C. and 10 s, and then, the shear test is performed. Also, in order to check the connection interface state, the observation of the cross section by SEM is performed and the identification of compound by EDX-analysis (an abbreviation of Energy Dispersive X-ray Spectroscopy) is performed.

As shown in FIG. 6, with respect to the specifications of the substrate and the metallization used in the evaluation, the number of pads is 256, the pitch between pads is 1.27 mm, the size (radius) of the pad is 0.62 mm, and the metallization structure is Au(0.75 μm)/Pd(0.2 μm)/an electroless Ni—P(8 μm).

Also, as shown in FIG. 7, with respect to the sorts of solders, the radius of the solder ball, and the opening shape of a paste printing mask used in the evaluation, the sort of solders (ball, paste, dip) is $Sn_3Ag_{0.5}Cu$, the radius of the solder ball is 0.4 mm, and the opening shape of a paste printing mask is φ0.8 mm×mask thickness of 0.1 mm.

With respect to the solder coating conditions, as shown in FIG. 8, the reflow temperatures are 230° C., 240° C. and 250° C. and the reflow times are 30 s, 60 s, 120 s and 180 s in the case of (1) solder ball connection. Also, the reflow temperatures are 230° C., 240° C. and 250° C. and the reflow times are 30 s, 60 s, 120 s and 180 s in the case of (2) solder paste printing, and the dip is 228° C.×30 s, the reflow temperatures are 230° C., 240° C. and 250° C. and the reflow times are 30 s, 60 s, 120 s and 180 s in the case of (3) dip+solder paste printing.

According to the study described above, as shown in FIG. 9, in the reflow at 240° C., in the case of (1) solder ball connection, the shearing load is always 1500 g or more and the degradation of the connection interface strength is not found. Also, since the solder is $Sn_3Ag_{0.5}Cu$, the Sn—Cu—Ni series compound is grown in the connection interface. Also, in the case of (2) solder paste printing, the degradation of the connection interface strength is found when the reflow time is increased. Also, the observation result of the cross section shows that a large number of the Pd—Sn compounds are present in the solder adjacent to the connection interface. However, in the case of (3) dip+solder paste printing, the degradation of the connection interface strength is not found similar to the case of (1), and the Pd—Sn compound seen in the case of (2) is not present within the range of L1=2 μm to L2=20 μm from the interface with the electrode pad 16.

The results are summarized as follows. As shown in FIG. 10, as is understood from the graphs showing the relation between the connection interface strength and the reflow conditions in each of the coating processes, in which the vertical axis represents the reflow temperature and the horizontal axis represents the reflow time, the connection interface strength in the case of (3) dip+solder paste printing is almost equal to that of the case of (1) solder ball connection. Therefore, the solder coating capable of preventing the degradation of the connection interface strength and the occurrence of the connection failure due to the warp and providing the desired thermal fatigue life can be realized by this solder coating method.

Subsequently, the result of the study for the connection interface strength after a stretch of time in the solder coating structure will be described. The samples and solder coating conditions used in the study for the connection interface strength after a stretch of time in the solder coating structure are identical to those shown in FIGS. 6 to 8.

For the comparison purpose, the three types of the solder coating processes are studied, that is, (1) the case where the solder ball is connected for the BGA connection, (2) the case of the solder paste printing only, and (3) the case where the solder paste printing is performed after the dipping. In each case, the evaluation of the connection interface strength is performed for the samples left under a high temperature conditions that the highest temperature is 212° C. (212° C. to 217° C.) and the temperature is kept at 198° C. or higher for 42 s after the solder coating. The connection interface strength is evaluated by means of the shear test, and the sample is inclined at 25° so as to sufficiently apply the load to the connection interface and the sample is shorn at the high velocity of 4 mm/s. Also, with respect to (2) and (3), since the solder bump height is insufficient for the shear test after the coating, the solder ball is connected under the reflow conditions of 230° C. and 10 s, and then, the shear test is performed. Also, in order to check the connection interface state, the observation of cross section by SEM is performed and the identification of compound by EDX-analysis is performed.

According to the study described above, in the reflow at 240° C., in the case of (1) solder ball connection, the degradation of the connection interface strength is not found. Also, in the case of (2) solder paste printing, the degradation of the connection interface strength is found. However, in the case of (3) dip+solder paste printing, the degradation of the connection interface strength is not found similar to the case of (1). Furthermore, according to the observation result of the cross section, the Pd—Sn compound and the Au—Sn compound seen in the case of (2) is not present within the range of L1=2 μm to L2=20 μm from the interface with the electrode pad 16. Consequently, the solder coating capable of preventing the degradation of the connection interface strength and the occurrence of the connection failure due to the warp and providing the desired thermal fatigue life can be realized by this solder coating method.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the embodiment described above, the semiconductor device with a package structure in which the semiconductor chip mounted on the substrate is encapsulated in the molding resin has been described. However, the present invention is not limited to this, and it can be applied to the wafer level package structure. More specifically, it can be applied to the package structure in which a semiconductor chip having an electrode pad is provided and a metal bump formed on the electrode pad functions as an external terminal.

Figure 11:
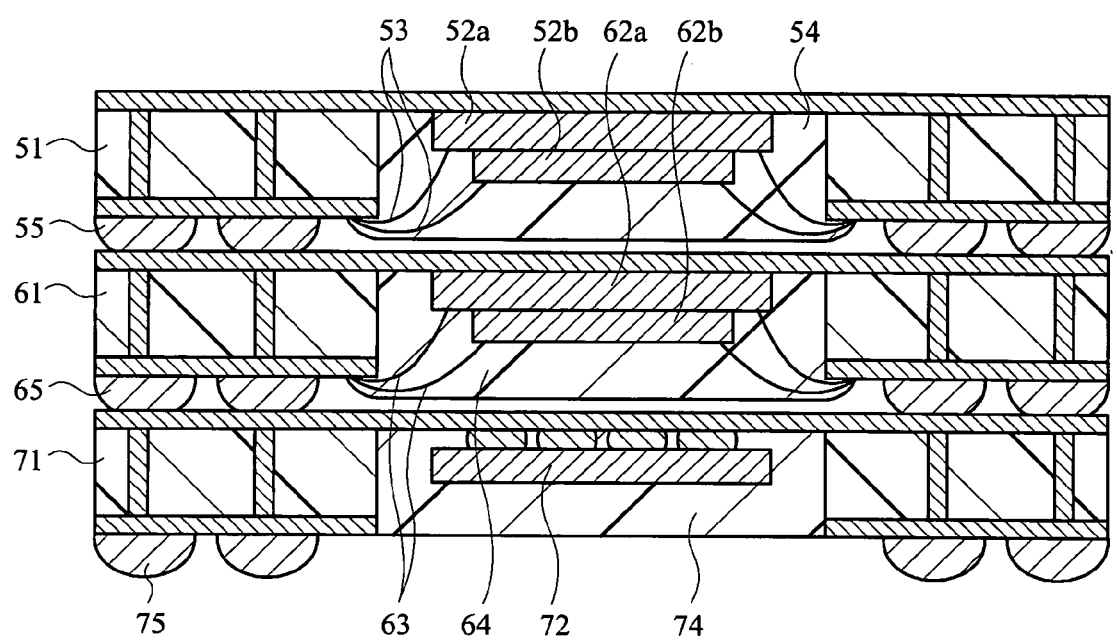
FIG. 11 is a cross-sectional view showing a modification example of the semiconductor device according to an embodiment of the present invention.
Figure 12A:
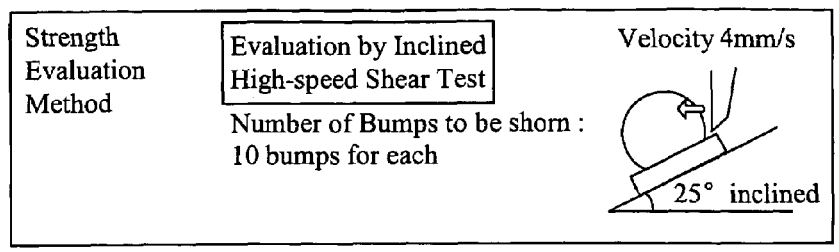
FIG. 12A to FIG. 12D are explanatory diagrams showing the evaluation result of the shear test for the samples in which $Sn_8Zn_3Bi$ solder ball is connected to the pad having the Au/Pd/an electroless Ni—P plating in the semiconductor device studied as a premise of the present invention.
Figure 12B:
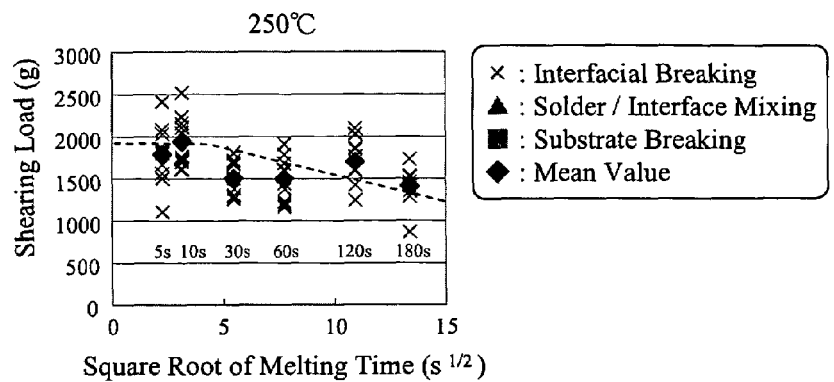
Figure 12C:
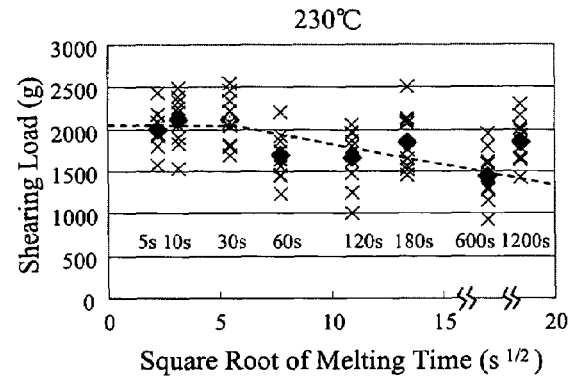
Figure 12D:
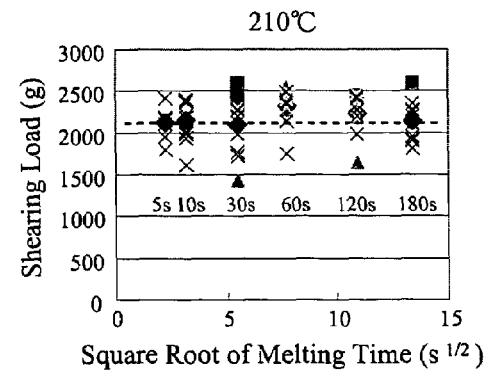
Figure 13:
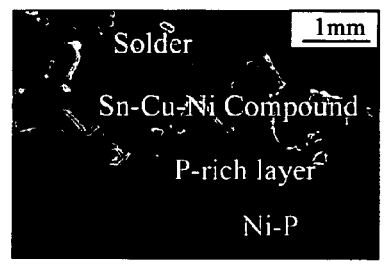
FIG. 13 is a diagram showing the observation result of the cross section of the connection interface by the SEM when the $Sn_3Ag_{0.5}Cu$ solder is connected to the pad having metallization of Au/Pd/an electroless Ni—P plating in the semiconductor device studied as a premise of the present invention.

In addition, the package structure of the semiconductor device can be applied to the semiconductor device with a thin-type stacked package structure as shown in FIG. 11. In this structure, the three packages are stacked. In the upper stage, the pads of the substrate 51 are provided on the same side as the metal bump 55, the two semiconductor chips 52a and 52b are stacked and mounted in the cavity of the substrate 51, the pads on the substrate 51 are electrically connected to the electrodes on each of the semiconductor chips 52a and 52b by the same wire bonding as that shown in FIG. 1, and the semiconductor chips 52a and 52b and the components of the bonding wire 53 in the cavity are encapsulated in the molding resin 54. The intermediate stage has the same structure as that of the upper stage (substrate 61, semiconductor chips 62a and 62b, bonding wire 63, molding resin 64 and metal bump 65). In the lower stage, the semiconductor chip 72 has the flip-chip structure, that is, the pads of the substrate 71 are provided in the cavity, the semiconductor chip 72 is mounted by the flip-chip bonding in the cavity of the substrate 71 and is electrically connected, and the cavity in which the semiconductor chip 72 is mounted is encapsulated in the molding resin 74. Even in the thin-type stacked package structure as described above, the solder coating capable of preventing the degradation of the connection interface strength and the occurrence of the connection failure due to the warp and providing the desired thermal fatigue life can be realized for the metal bumps 55, 65 and 75 (bump 75 is the metal bump for the package) in each of the stages by the solder coating method described above.

The semiconductor device and the manufacturing method thereof according to the present invention can be applied to the technology in which the space reduction and performance improvement of a mobile device are expected and the further fine pitch is employed in the future. More specifically, it can be expected that the amount of solder at the connecting portions used for the connection will be reduced and the demand for the connection in the system in which a large number of compounds are present in the solder adjacent to the connection interface will be increased more and more. The present invention can provide the effective solder connection method for such a connection system.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A semiconductor device, comprising: an electrode pad, a metal layer formed on said electrode pad, and a metal bump formed on said metal layer, wherein said metal layer contains Au, said metal bump has an average bump height in one electrode pad per unit area of 100 μm or less and is made of solder mainly made of Sn, a concentration of Au of said metal layer dissolved in the solder of said metal bump is $1.3 \times 10^{-3}$ (Vol %) or less, said metal layer contains Pd in addition to Au, and said metal bump is characterized in that compound formed by reacting Pd of said metal layer formed on said electrode pad before connecting said metal bump with said metal bump is not present in a row within a range of 2 to 20 μm from the interface between said metal bump and the electrode pad on which said metal bump is connected.

2. The semiconductor device according to claim 1, further comprising:
   a substrate provided with said electrode pad and a semiconductor chip mounted on said substrate,
   wherein said metal bump formed on said electrode pad functions as an external terminal.

3. The semiconductor device according to claim 1, further comprising:
   a semiconductor chip on which said electrode pad is provided,
   wherein said metal bump formed on said electrode pad functions as an external terminal.

4. A semiconductor device comprising: an electrode pad, a metal layer formed on said electrode pad, and a metal bump formed on said metal layer,
   wherein said metal layer contains Au,
   said metal bump has an average bump height in one electrode pad oer unit area of 100 μm or less and is made of solder mainly made of Sn,
   a concentration of Au of said metal layer dissolved in the solder of said metal bump is $1.3 \times 10^{-3}$ (Vol %) or less,
   said metal layer contains Pd in addition to Au, and
   said metal bump is characterized in that, after a stretch of time under the high-temperature condition of highest temperature of 212 to 217° C. and retention time at 198° C. or higher of 42 seconds, compound formed by reacting Au of said metal layer formed on said electrode pad before connecting said metal bump with said metal bump is not present in a row within a range of 2 to 20 μm from the interface between said metal bump and said electrode pad on which said metal bump is connected.

5. The semiconductor device according to claim 4, further comprising:
   a substrate provided with said electrode pad and a semiconductor chip mounted on said substrate,
   wherein said metal bump formed on said electrode pad functions as an external terminal.

6. The semiconductor device according to claim 4, further comprising:
   a semiconductor chip on which said electrode pad is provided,
   wherein said metal bump formed on said electrode pad functions as an external terminal.

7. The semiconductor device according to claim 4, wherein said metal layer contains Pd in addition to Au.

* * * * *